United States Patent [19]

Burgener et al.

[11] Patent Number: 5,009,385
[45] Date of Patent: Apr. 23, 1991

[54] MOUNTING ARRANGEMENT FOR AVIONICS EQUIPMENT

[75] Inventors: Larry L. Burgener; Larry L. Durbin, both of Phoenix, Ariz.

[73] Assignee: Honeywell Inc., Minneapolis, Minn.

[21] Appl. No.: 446,107

[22] Filed: Dec. 5, 1989

[51] Int. Cl.$^5$ .............................................. G01D 11/30
[52] U.S. Cl. ..................................... 248/346; 248/310; 248/357; 248/912; 248/913
[58] Field of Search ............ 248/346, 187, 558, 231.3, 248/177, 558, 645, 678, 681, 680, 310, 357, 117.6–117.7, 911, 912; 206/1.5; 292/DIG. 7

[56] References Cited

U.S. PATENT DOCUMENTS

| | | |
|---|---|---|
| 807,613 | 12/1905 | Graves . |
| 2,326,469 | 8/1943 | Leichner ............................ 248/309 |
| 2,631,800 | 3/1953 | Pinkston ............................. 248/23 |
| 2,905,427 | 9/1959 | Roeder, Jr. ........................ 248/346 |
| 3,356,325 | 12/1967 | Schnase ............................. 248/187 |
| 3,429,543 | 2/1969 | Mooney ............................. 248/346 |
| 3,430,906 | 3/1969 | Danz et al. ........................ 248/310 |
| 4,057,816 | 11/1977 | Killian, Jr. et al. ............... 248/187 |
| 4,502,656 | 3/1985 | Zeitler .............................. 248/346 |
| 4,529,150 | 7/1985 | Owen et al. ....................... 244/1 R |
| 4,696,499 | 9/1987 | Woo et al. ........................ 248/553 |

Primary Examiner—Karen J. Chotkowski
Attorney, Agent, or Firm—Kinney & Lange

[57] ABSTRACT

An arrangement for releasably securing an equipment or instrumentation box in the cockpit of aircraft in alternate orientations by having one portion of the box apertured to cooperate with pins on a mounting tray and another portion slotted to cooperate with a biasing clamp on the mounting tray.

14 Claims, 2 Drawing Sheets

MOUNTING ARRANGEMENT FOR AVIONICS EQUIPMENT

BACKGROUND OF THE INVENTION

1. Field of the Invention

The present invention is directed toward arrangements for mounting avionics equipment in an aircraft so that it may be positioned in various orientations to accommodate the usually crowded conditions in a cockpit and yet be easily mounted and easily removed.

2. Description of the Prior Art

In present day aircraft, the housings for avionics equipment are generally box-shaped, but otherwise irregular and nonstandardized in shape and construction. Furthermore, the space available for the housings to be mounted is limited and often equally irregular and nonstandardized. Accordingly, to install new equipment in an aircraft at a position desired it has heretofore frequently been necessary to customize the housings for each individual application and, in some cases, even to redesign part of the cockpit as well. This results in excessive costs because of the amounts of both materials and time used as a result of even minor equipment modifications.

In general, techniques for mounting equipment within the cockpit of an aircraft are well known. For example, U.S. Pat. No. 4,529,150, granted to James B. Owen and Peter R. Wilkinson of Preston, England, shows an assembly for mounting equipment within an aircraft cockpit, which includes a locking pin arrangement with cams, to enable the mounting of the equipment and to allow movement between stowed and display positions thereof. However, the arrangement is very elaborate and allows no flexibility since it effectively predetermines how the equipment will be stowed and mounted without any other alternatives or options. The approach of Owen is accordingly unsuitable for mounting avionics equipment in any sort of flexible manner.

SUMMARY OF THE INVENTION

The present invention is directed toward the mounting of equipment in any one of several orientations so as to flexibly fit at a desired location and still be conveniently installed and removed in a crowded environment, such as an aircraft or space vehicle.

According to one version of the invention, a generally rectangular equipment box is inserted into an equipment tray with one or more mating apertures and alignment guide pins and is then secured in place with a cam clamp and cooperating slots. For example, the equipment box may have a first pair of apertures or holes in one surface which can accept a pair of alignment guide pins on the tray and a second pair of apertures on a different part of the same surface, or on a different surface which can also accept the guide pins, for use when the box is desired in a different orientation. Then, at another location on the box, slots may be formed which can accept the edge of a cam mounted on the tray. The cam may rotate to wedge an eccentric surface into the slot to thereby secure the box and tray together in either orientation. This provides the desired flexibility in positioning the equipment box in the cockpit. Alternately, the tray may have the apertures or receiving holes with the guide pins placed in several different positions on the box. The cam clamp can also be alternately mounted on the box to cooperate with a slot on the tray. The tray may be fastened to the airframe in any desired location by conventional means and more than one tray may be employed to accommodate different sized sides and thus increase flexibility.

BRIEF DESCRIPTION OF THE DRAWING

The objects and advantages of the invention will become particularly apparent from a detailed consideration of the drawings which follow. The drawings include following Figures, in which.

DETAILED DESCRIPTION OF THE PREFERRED EMBODIMENTS

Figure 1:
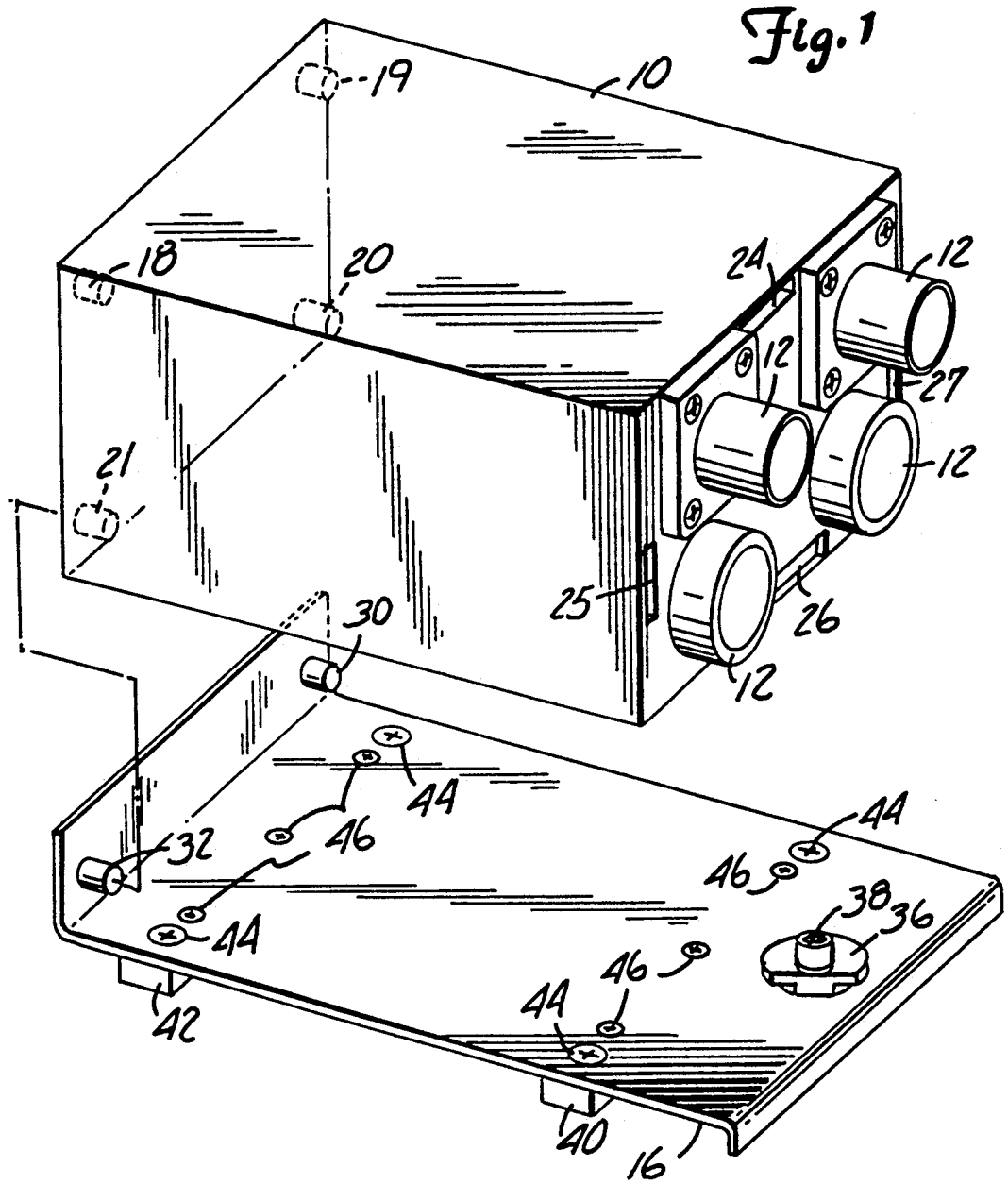
FIG. 1 is an isometric view of an equipment box and tray arrangement of the invention, according to a wide body version thereof.

FIG. 1 shows a preferred version of the invention wherein an equipment housing or box 10 has a plurality of connectors 12 for use in providing electrical connections between the electronics in box 10 and aircraft circuits (not shown). Box is positioned in a horizontal manner with a wide side downward and is to be mounted on a "Z" shaped tray 16. This configuration may be used where space limitations or desired orientations of the box 10 require less vertical space than horizontal space. The replaceable equipment box 10, according to the invention, includes multiple alignment holes or indentations 18, 19, 20 and 21 on one end and, on the other end along the edges thereof, includes multiple mounting slots 24, 25, 26 and 27.

Figure 2:
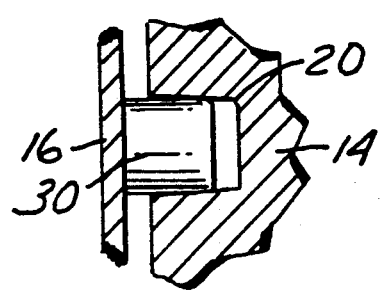
FIG. 2 is a cross section view of a slightly tapered alignment pin and aperture arrangement.
Figure 3:
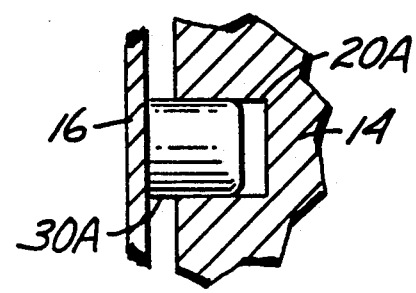
FIG. 3 is a cross section view of an alternate pin and aperture arrangement.

As further shown in Figure tray 16 is preferably formed of sheet metal in a "Z" shape, providing the needed degree of tray rigidity to enable effective clamping of the box 10 in tray 16. Tray 16 is shown having a pair of alignment pins 30 and 32 on the upwardly extending end thereof which are spaced so as to cooperate with the holes 20 and 21 of box 10 or, if inverted, with holes 18 and 19. FIG. 2 shows pin 30 in hole 20 where the hole 20 is tapered to assure a snug fit. Alternately, as shown in FIG. 3, hole 20A may be machined straight to provide a close fit with pin 30A. It should be understood that while I have shown the holes to be in box 10 and the pins to be on tray 16, the opposite arrangement could be employed with the holes on tray 16 and the pins on box 10.

On the right end of tray 16, an eccentric member, such as a cam clamp 36, is shown rotatably attached to tray 16 by means of, for example, a threaded insert in the tray 16 which receives the tip of a retaining screw 38. Cam clamp 36 is shaped so that, when rotated to a first position, a flat part thereof allows the edge of box 10 to pass downwardly so that the underside of box 10 comes to rest on the tray 16. Thereafter, the cam clamp 36 may be rotated so that an edge thereof wedges into the slot 26 in box 10, or in the inverted position slot 24, thereby holding box 10 securely on tray 16. Cam clamp 36 preferably comprises a flanged washer, with an eccentric mounting hole, able to be rotated against the equipment box 10 with its flange entering mounting slot 26 or 24. After wedging occurs, retaining screw 38 can be tightened to prevent the equipment box 10 from becoming accidentally detached from the tray 16. Instead of an eccentric mounting hole, the cam edge may have a varying thickness so that when rotated, the edge forces the equipment box 10 against tray 16.

Tray 16 may be mounted onto the airframe (not shown) by means of mounting bases 40 and 42 and bolts such as 44, for example. Bases 40 may be attached to the underside of tray 16 with screws such as 46, for example.

Equipment box 10 can be removed from tray 16 by simply loosening restraining screw 38 and rotating cam clamp 36 counterclockwise to disengage the flange of cam clamp 36 from mounting slot 26 and pulling the equipment box 10 away from alignment pins 30 and 32.

It is seen that mounting slots 24, 25, 26 and 27 may be symmetrically arranged on the edges of the equipment box 10 so that regardless of which side of box 10 is downward, cam 36 will fit in one of the slots. Similarly, alignment holes 18, 19, 20 and 21 as well as alignment pins 30 and 32 may be cooperatively, symmetrically arranged about corresponding edges of the equipment box 10 and tray 16, respectively, so that any selected side of the equipment box 10 may be mounted directly on tray 16. If, for example, the distance between holes 18 and 21 is the same as between holes 20 and 21, the box 10 could be mounted on tray 16 ninety degrees from the position shown with cam 36 binding in slot 25 to hold the box 10 down against tray 16. Furthermore, if all of the holes 18-21 were equally spaced, any one of the four sides of the equipment box could be downward against tray 16 and, on opposite ends thereof, the corresponding mounting slots 24-27 would cooperate with cam 36. Accordingly, the invention permits any one of the sides of equipment box 10 to be mounted directly on tray 16 Apertures formed in other sides of the box could also be used to mount the box in yet further orientations so long as clamp slots in corresponding locations were made to cooperate with cam 36.

Figure 4:
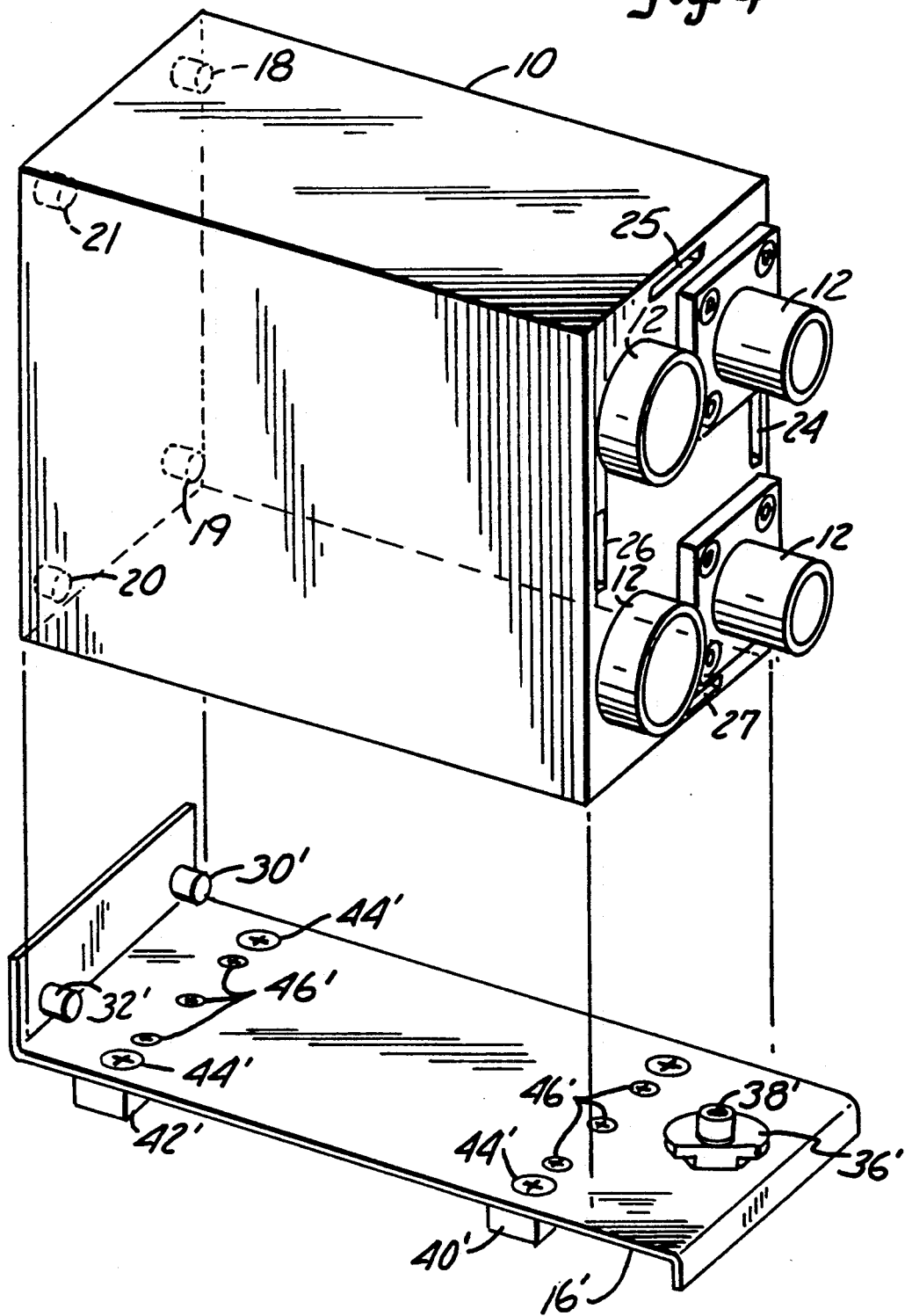
FIG. 4 is an isometric view of the equipment box and tray arrangement of the invention, according to a narrow body version thereof.

In the event that it is impractical to utilize equally spaced holes 18-21, the box 10 may be mounted in the more vertical position, by utilizing the embodiment of FIG. 4.

In FIG. 4, the box 10 is shown with a more narrow side on the upper and lower horizontal surfaces. In other words, the box 10 has been rotated ninety degrees from its position in FIG. 1. With the rotation, holes 18, 19, 20 and 21 now occupy different positions, with holes 19 and 20 on the bottom. Likewise, the slots 24, 25, 26 and 27 have also rotated and slot 27 is now on the bottom. The tray 16 of FIG. 1 is now narrower and has been numbered 16'. Tray 16' now has a more closely spaced pair of pins 30' and 32' on one end and a rotatable cam 36' held by screw 38' on the other. The mounting members 40' and 42' now attach to the airframe (not shown) and are affixed thereto by bolts 44' and to tray 16' by screws 46'. The cam 36' now rotates into slot 27, or in the inverted position slot 25, to hold the box 10 against movement with respect to tray 16'.

Accordingly, as was the case in FIG. 1, equipment box 10 can be secured against tray 16' directly or rotated one hundred and eighty (180°) degrees and, if the apertures 20-21 and 18-19 are the same distance apart as apertures 19-20, box 10 can be held against alternate tray 16' in FIG. 4, rotated ninety (90°) or two hundred and seventy (270°) degrees. This provides unique flexibility in the placement and orientation of avionics equipment in the cockpit of an aircraft.

Of course, it will be recognized by those skilled in the art that the box 10 need not be rectangular in configuration and that other shapes will be quite acceptable to the mounting invention described herein. Likewise, the specific arrangement of holes and pins may be altered to reverse them or to space them in alternate positions. The shape of the cam 36 and the specific way of attaching it to the tray may be altered without departing from the spirit of the invention. Accordingly, although the present invention has been described with reference to the preferred embodiments, those skilled in the art will recognize that many changes may be made in form and detail without departing from the spirit and scope of the invention.

What is claimed is:

1. An arrangement for mounting first and second members together in at least first and second orientations comprising:

first and second members a pair of apertures spaced a predetermined distance apart on the first member at a first location and a first pair of guide pins spaced the predetermined distance apart on the second member, the first pair of pins fitting within the first pair of apertures to position the first member with respect to the second member in a first orientation;

a second pair of apertures spaced the predetermined distance apart on the first member at a second location, the first pair of guide pins fitting within the second pair of apertures to position the first member with respect to the second member in a second orientation; and eccentric clamping means having first and second cooperating parts one of which is movable from a first position to a second position so as to be into and out of engagement with the other of the cooperating parts, respectively, to cause clamping, at least two of the first cooperating parts being located on the first member, each at a predetermined position with respect to a different one of the pairs of apertures and the second cooperating part being positioned on the second member at the predetermined position with respect to the first and second guide pins so that when the movable one of the cooperating parts is in the first position, the first and second members may be placed in a chosen one of the first and second orientations, and when in the second position, the first and second members are clamped to assure the chosen orientation is maintained.

2. Apparatus according to claim 1 wherein the first and second members comprise a housing for equipment to be used on a craft and a tray to be fastened to the craft, respectively.

3. Apparatus according to claim 2 wherein the apertures are formed in the housing and the guide pins are formed on the tray.

4. Apparatus according to claim 1 wherein the first and second cooperating parts of the clamping means comprise an eccentric cam and a slot, respectively.

5. Apparatus according to claim 4 wherein the first and second members comprise a housing for equipment to be used on a craft and a tray fastened to the craft.

6. Apparatus according to claim 5 wherein the apertures are formed in the housing and the guide pins are formed on the tray.

7. Apparatus according to claim 4 wherein the eccentric cam is a washer mounted in an eccentric mounting hole.

8. Apparatus according to claim 4 wherein the eccentric cam is a washer of varying thickness to wedge in the slot to bind the first and second members together.

9. Apparatus according to claim 8 wherein the first and second members comprise a housing for equipment to be used on a craft and a tray to be fixed to the craft.

10. Apparatus according to claim 9 wherein the apertures are formed in the housing and the guide pins are formed on the tray.

11. Apparatus according to claim 1 wherein the second member is a "Z" shaped member for providing rigidity.

12. Apparatus according to claim 3 wherein the housing is generally rectangular and the tray is "Z" shaped.

13. Equipment mounting apparatus comprising:
 a housing for holding the equipment;
 first and second apertures on the housing spaced a first distance apart;
 a first elongated slot on the housing remote from the first and second apertures;
 a third aperture on the housing spaced a second distance from the second aperture;
 a second elongated slot on the housing remote from the second and third apertures;
 first and second mounting members each having a first flat portion with first and second ends, the first end being at substantially right angles to the flat portion;
 first and second guide pins on the first end of the first mounting member spaced apart by the first distance and extending from the second end over the flat portion;
 a first rotatable eccentric cam on the second end of the first mounting member, the first and second guide pins fitting within the first and second apertures of the housing and the first cam rotating into the first elongated slot to wedge the housing in a first orientation with respect to the mounting member;
 third and fourth guide pins on the first end of the second mounting member spaced apart by the second distance and extending over the flat portion; and
 a second rotatable eccentric cam on the second end of the second mounting member, the third and fourth guide pins fitting within the second and third apertures of the housing and the second cam rotating into the second elongated slot to wedge the housing in a second orientation with respect to the mounting member.

14. Apparatus according to claim 13 wherein the first and second orientations are at substantially right angles with respect to each other.

* * * * *